(12) United States Patent
Wu et al.

(10) Patent No.: US 12,261,159 B2
(45) Date of Patent: Mar. 25, 2025

(54) MICRO-LIGHT-EMITTING DIODE DISPLAY PANEL

(71) Applicant: Prilit Optronics, Inc., Tainan (TW)

(72) Inventors: Biing-Seng Wu, Tainan (TW);
Chao-Wen Wu, Tainan (TW);
Hsing-Ying Lee, Tainan (TW);
Chun-Bin Wen, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 486 days.

(21) Appl. No.: 17/678,730

(22) Filed: Feb. 23, 2022

(65) Prior Publication Data

US 2023/0104979 A1 Apr. 6, 2023

Related U.S. Application Data

(60) Provisional application No. 63/257,124, filed on Oct. 19, 2021, provisional application No. 63/252,497, filed on Oct. 5, 2021.

(51) Int. Cl.
| | |
|---|---|
| H01L 25/16 | (2023.01) |
| H10H 20/856 | (2025.01) |
| H10H 20/852 | (2025.01) |

(52) U.S. Cl.
CPC ......... *H01L 25/167* (2013.01); *H10H 20/856* (2025.01); *H10H 20/852* (2025.01)

(58) Field of Classification Search
None
See application file for complete search history.

(56) References Cited

U.S. PATENT DOCUMENTS

| | | | | |
|---|---|---|---|---|
| 2016/0351539 A1* | 12/2016 | Bower | .............. | H01L 25/0655 |
| 2018/0092173 A1* | 3/2018 | Wu | ..................... | H01L 25/0753 |
| 2018/0096878 A1* | 4/2018 | Wu | ..................... | H01L 21/67144 |
| 2019/0013307 A1* | 1/2019 | Wu | ..................... | H01L 25/0753 |
| 2019/0043844 A1* | 2/2019 | Liu | ...................... | H01L 25/0753 |
| 2022/0029068 A1* | 1/2022 | Luo | ........................ | C09D 4/06 |
| 2022/0246794 A1* | 8/2022 | Sun | ........................ | H01L 33/10 |

* cited by examiner

*Primary Examiner* — Bilkis Jahan
(74) *Attorney, Agent, or Firm* — Donald E. Stout; Stout, Uxa & Buyan, LLP

(57) ABSTRACT

A micro-light-emitting diode (microLED) display panel includes a substrate; a plurality of microLEDs disposed and arranged in rows and columns on the substrate; a driver disposed on the substrate; a plurality of first blocking walls respectively disposed between rows of the microLEDs; and a plurality of second blocking walls respectively disposed between the microLEDs of the same row.

14 Claims, 4 Drawing Sheets

MICRO-LIGHT-EMITTING DIODE DISPLAY PANEL

CROSS-REFERENCE TO RELATED APPLICATIONS

This application claims the benefit of U.S. Provisional Application No. 63/252,497, filed on Oct. 5, 2021, and No. 63/257,124, filed on Oct. 19, 2021. The entire contents of each of these applications are herein expressly incorporated by reference.

BACKGROUND OF THE INVENTION

1. Field of the Invention

The present invention generally relates to micro-light-emitting diodes (microLEDs), and more particularly to a microLED display panel.

2. Description of Related Art

A micro-light-emitting diode (microLED, mLED or μLED) display panel is one of flat display panels, and is composed of microscopic microLEDs each having a size of 1-100 micrometers. Compared to conventional liquid crystal display panels, the microLED display panels offer better contrast, response time and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

Modern microLED display panels commonly have driver integrated circuits (ICs) disposed on the substrate. As the driver ICs have a height (e.g., 150 um) substantially greater than the microLEDs (e.g., with a height of 7-10 um), usually with a ratio of fifteen or higher, the viewing angle of the LED display panels is thus greatly confined. Therefore, the vertical viewing angle (along longitudinal direction) may be less than 90 degrees, for example, 36-56 degrees, while the horizontal viewing angle (along lateral direction) may be about 180 degrees. The discrepancy between the vertical viewing angle and the horizontal viewing angle may cause visual discomfort.

Particularly, with respect to a large-scale display with a side greater than a person, the driver ICs may partially block the light emitted by the microLEDs and cause shadow, thereby resulting in dark stripes on the display. Furthermore, light crosstalk between microLEDs may occur as well.

A need has thus arisen to propose a novel scheme for overcoming the drawbacks of the conventional microLED display panels.

SUMMARY OF THE INVENTION

In view of the foregoing, it is an object of the embodiment of the present invention to provide a microLED display panel with lighting uniformity that is capable of preventing visual discomfort due to discrepant viewing angles and reducing light crosstalk between microLEDs with improved optical performance.

According to one embodiment, a micro-light-emitting diode (microLED) display panel includes a substrate, microLEDs, a driver, first blocking walls and second blocking walls. The microLEDs are disposed and arranged in rows and columns on the substrate. The driver is disposed on the substrate. The first blocking walls are respectively disposed between rows of the microLEDs, and the second blocking walls are respectively disposed between the microLEDs of the same row.

DETAILED DESCRIPTION OF THE INVENTION

Figure 1:
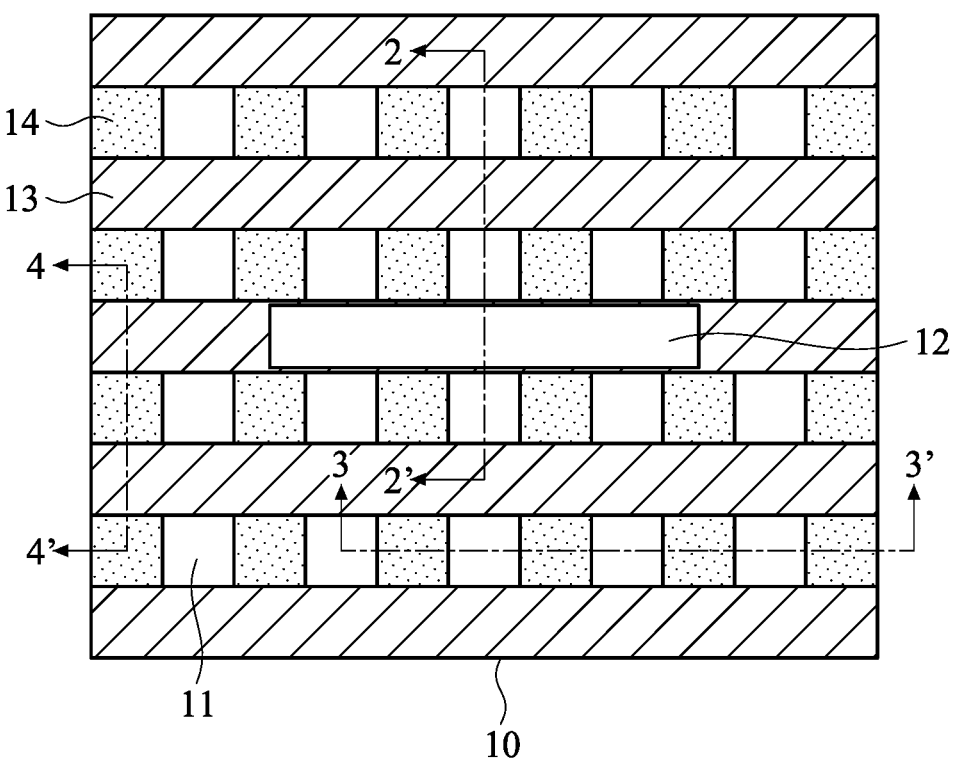
FIG. 1 shows a schematic diagram illustrating a top view of a micro-light-emitting diode (microLED) display panel according to one embodiment of the present invention.

FIG. 1 shows a schematic diagram illustrating a top view of a micro-light-emitting diode (microLED) display panel 100 according to one embodiment of the present invention.

In the embodiment, the microLED display panel 100 may include a plurality of microLEDs 11 arranged in rows and columns (i.e., in matrix form), and disposed on a substrate 10, for example, a transparent substrate such as glass substrate. Each microLED 11 shown in FIG. 1 and the following figures may represent a single microLED or may be composed of sub-microLEDs, for example, red sub-microLED, green sub-microLED and blue sub-microLED. In one embodiment, the microLED display panel 100 is a top-emission display panel that emits light upward or against the substrate 10. The microLED display panel 100 may include at least one driver 12, such as an integrated circuit, disposed on the substrate 10. In the embodiment, the microLEDs 11 are driven by a passive matrix addressing (or driving) scheme.

According to one aspect of the embodiment, the microLED display panel 100 may include a plurality of first blocking walls 13 respectively disposed between rows of the microLEDs 11, and disposed on or above the substrate 10. The first blocking walls 13 are used to block light, and may include an opaque material. In one exemplary embodiment, the first blocking walls 13 may further include a nonreflective material.

As exemplified in FIG. 1, the first blocking walls 13 are disposed laterally in a first direction (e.g., X axis) and are separated by the rows of the microLEDs 11. Moreover, the first blocking walls 13 are parallel with the driver 12, which is also disposed laterally (e.g., in X axis). In the embodiment, the first blocking walls 13 may or may not cover the driver 12.

Figure 2:
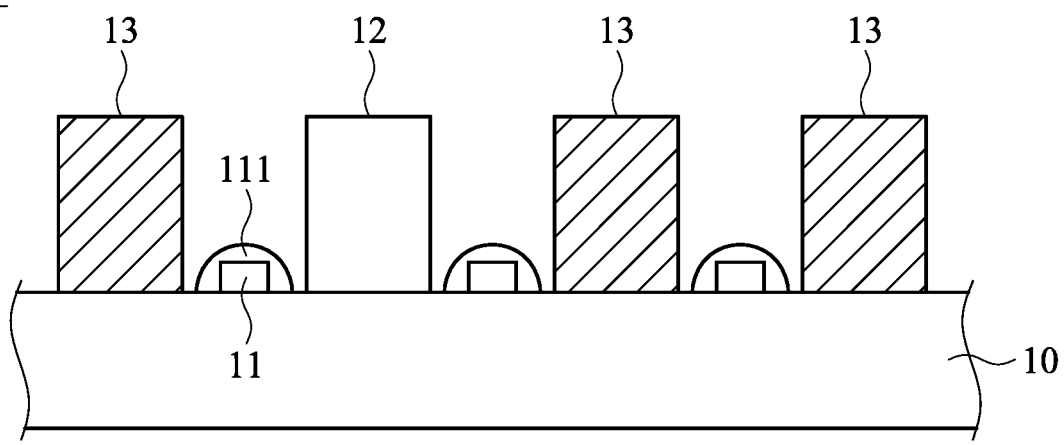
FIG. 2 shows a schematic diagram illustrating a cross-sectional view of the microLED display panel along a cross line 2-2' of FIG. 1.

FIG. 2 shows a schematic diagram illustrating a cross-sectional view of the microLED display panel 100 along a cross line 2-2' of FIG. 1. As exemplified in FIG. 2, each of the microLEDs 11 may be covered with at least one encapsulation layer 111, which may have a profile of round, oval or rectangular shape. The encapsulation layer 111 of the embodiment has reflectivity greater than 1. The first blocking wall 13 may have a profile (e.g., round, oval or rectangular shape) compatible with the encapsulation layer 111. In the embodiment, a height of the first blocking wall 13 is the same as or greater than a height of the driver 12. Preferably, the height of the first blocking wall 13 is comparable with the height of the driver 12. In one example, the driver 12 has a height of 150 micrometers (um) and the first blocking wall 13 has a height of 150-200 um.

Figure 3:
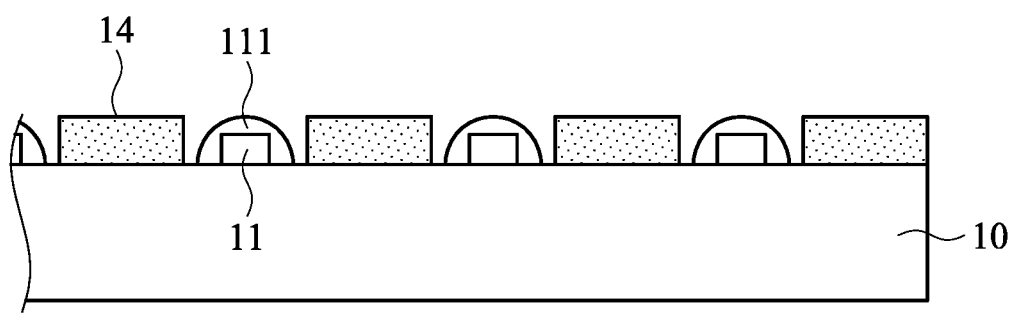
FIG. 3 shows a schematic diagram illustrating a cross-sectional view of the microLED display panel along a cross line 3-3' of FIG. 1.

FIG. 3 shows a schematic diagram illustrating a cross-sectional view of the microLED display panel 100 along a cross line 3-3' of FIG. 1. According to another aspect of the embodiment, referring to FIG. 1 and FIG. 3, the microLED display panel 100 of the embodiment may include a plurality of second blocking walls 14 respectively disposed between microLEDs 11 of the same row, and disposed on the substrate 10. The second blocking walls 14 are used to block light, and may include an opaque material. In one exemplary embodiment, the second blocking walls 14 may further include a nonreflective material. Generally speaking, orientation of the first blocking walls 13 and the second blocking walls 14 may be determined according to viewing angle requirement and/or orientation of the driver 12. The second blocking wall 14 may have a profile (e.g., round, oval or rectangular shape) compatible with the encapsulation layer 111. In order not to obstruct lighting of the microLEDs 11, the second blocking walls 14 do not cover the microLEDs 11.

The height of the first blocking wall 13 is substantially larger than a height of the second blocking wall 14. In one exemplary embodiment, the ratio of the first blocking wall 13 to the second blocking wall 14 in height is approximately the same as the ratio of the driver 12 to the microLED 11 in height.

In the embodiment, a height of the second blocking wall 14 is the same as or greater than a height of the microLED 11. Preferably, the height of the second blocking wall 14 is comparable with the height of the microLED 11. In one example, the microLED 11 has a height of 7-10 um and the second blocking wall 14 has a height of 10-20 um.

Figure 4A:
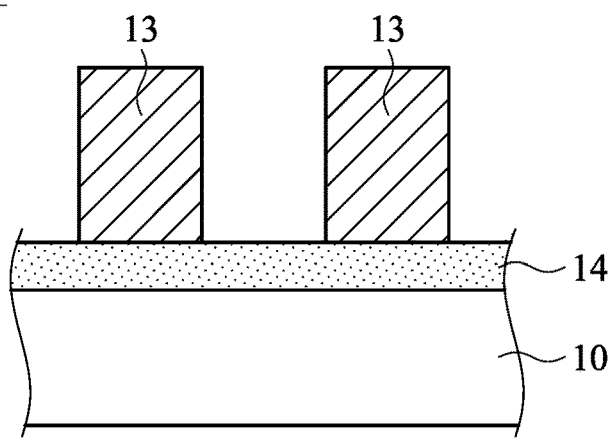
FIG. 4A shows a schematic diagram illustrating a cross-sectional view of the microLED display panel along a cross line 4-4' of FIG. 1.

FIG. 4A shows a schematic diagram illustrating a cross-sectional view of the microLED display panel 100 along a cross line 4-4' of FIG. 1. Referring to FIG. 1 and FIG. 4A, the second blocking walls 14 are disposed longitudinally (e.g., in Y axis) between columns of microLEDs 11 on the substrate 10. Subsequently, the first blocking walls 13 are disposed laterally (e.g., in X axis) between rows of microLEDs 11 on the substrate 10 and between the second blocking walls 14. In one exemplary embodiment, the second blocking walls 14 and the first blocking walls 13 may be coated in sequence by a dispenser or an inkjet. In another example, the second blocking walls 14 and the first blocking walls 13 may be coated in sequence by photolithography technique, capable of forming the second blocking walls 14 and the first blocking walls 13 more precisely than the dispenser or inkjet. In either case, the total height at the overlapped area (of the second blocking walls 14 and the first blocking walls 13) is the added heights of the second blocking wall 14 and the first blocking wall 13.

Figure 4B:
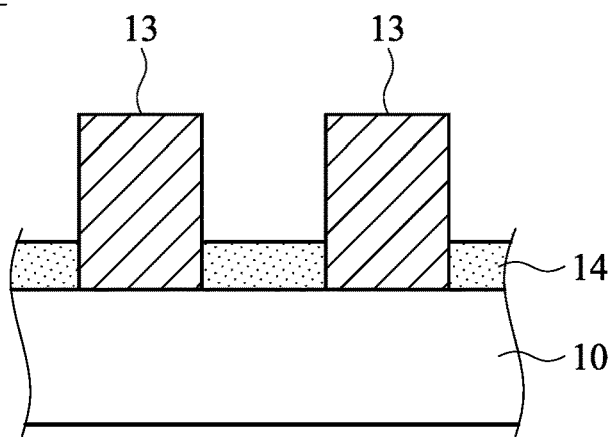
FIG. 4B shows a schematic diagram illustrating another cross-sectional view of the microLED display panel along a cross line 4-4' of FIG. 1.
Figure 4C:
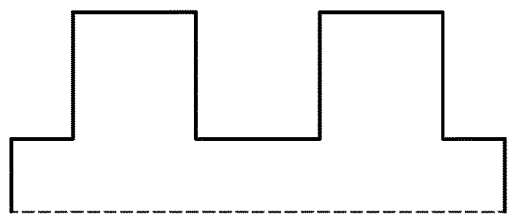
FIG. 4C shows a schematic diagram illustrating a mold adaptable for coating the first blocking walls and the second blocking walls.

FIG. 4B shows a schematic diagram illustrating another cross-sectional view of the microLED display panel 100 along a cross line 4-4' of FIG. 1. Referring to FIG. 1 and FIG. 4B, the first blocking walls 13 and the second blocking walls 14 are coated on the substrate 10 at the same time (without overlapping). In one exemplary embodiment, a molding process is adopted by using a mold (a schematic diagram is shown in FIG. 4C), which is a hollowed-out block that may be filled with an opaque material.

Figure 5:
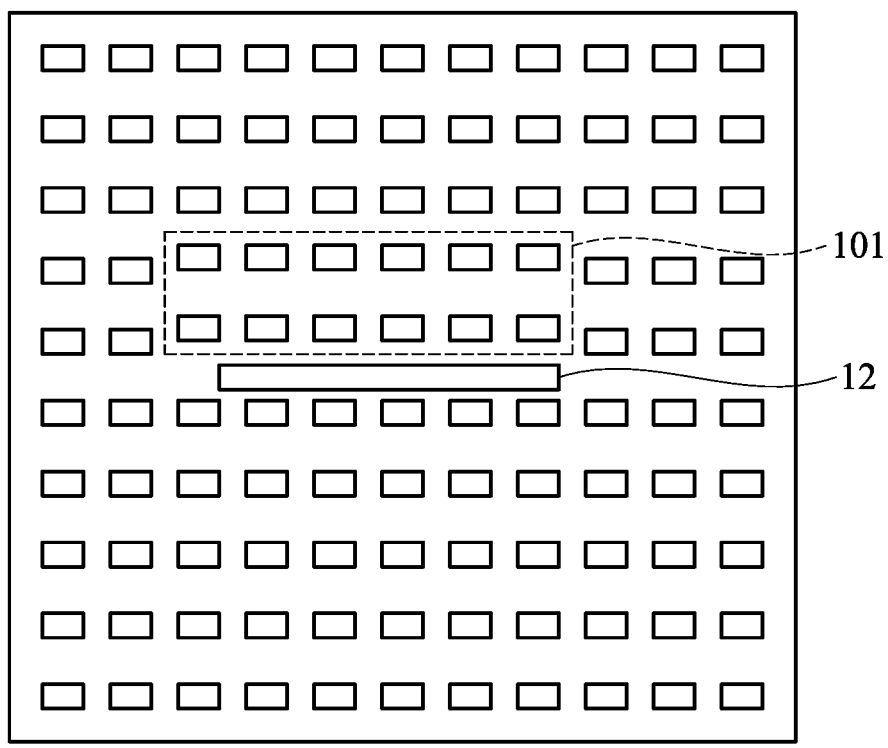
FIG. 5 shows a schematic diagram illustrating a top view of a microLED display panel according to one embodiment of the present invention.

It is appreciated that the microLEDs 11 in the preceding embodiments need not be arranged symmetrically in one or more directions. FIG. 5 shows a schematic diagram illustrating a top view of a microLED display panel 100 according to one embodiment of the present invention. According to a further aspect of the embodiment, microLEDs 11 within an area 101 adjacent to the driver 12 may be asymmetrically arranged along at least one direction with respect to microLEDs 11 outside the area 101. As exemplified in FIG. 5, two (partial) rows of microLEDs 11 within the area 101 adjacent to the top of the driver 12 are shifted upward with respect to microLEDs 11 outside the area 101. The shifting distance may be determined according to viewing angle requirement or size/resolution of the display. In one example, the top row of microLEDs 11 within the area 101 is shifted upward with 50-100 um with respect to microLEDs 11 outside the area 101, and the bottom row of microLEDs 11 within the area 101 is shifted upward with 50-150 um with respect to microLEDs 11 outside the area 101.

Although specific embodiments have been illustrated and described, it will be appreciated by those skilled in the art that various modifications may be made without departing from the scope of the present invention, which is intended to be limited solely by the appended claims.

What is claimed is:

1. A micro-light-emitting diode (microLED) display panel, comprising:
   a substrate;
   a plurality of microLEDs disposed and arranged in rows and columns on the substrate;
   a driver disposed on the substrate;
   a plurality of first blocking walls respectively disposed between rows of the microLEDs; and
   a plurality of second blocking walls respectively disposed between the microLEDs of the same row;
   wherein the second blocking walls and the first blocking walls are coated in sequence, and the first blocking walls overlap the second blocking walls.

2. The panel of claim 1, wherein the first blocking walls and the second blocking walls comprise an opaque material.

3. The panel of claim 2, wherein the first blocking walls and the second blocking walls comprise a nonreflective material.

4. The panel of claim 1, further comprising:
   an encapsulation layer covering each of the microLEDs.

5. The panel of claim 4, wherein the encapsulation layer has reflectivity greater than 1.

6. The panel of claim 1, wherein a height of the first blocking wall is the same as or greater than a height of the driver, and a height of the second blocking wall is the same as or greater than a height of the microLED.

7. The panel of claim 6, wherein the height of the first blocking wall is larger than the height of the second blocking wall.

8. The panel of claim 7, wherein a ratio of the first blocking wall to the second blocking wall in height is the same as a ratio of the driver to the microLED in height.

9. The panel of claim 1, wherein the second blocking walls and the first blocking walls are coated by a dispenser, an inkjet or photolithography.

10. A micro-light-emitting diode (microLED) display panel, comprising:
- a substrate;
- a plurality of microLEDs disposed and arranged in rows and columns on the substrate;
- a driver disposed on the substrate;
- a plurality of first blocking walls respectively disposed between rows of the microLEDs; and
- a plurality of second blocking walls respectively disposed between the microLEDs of the same row;

wherein the first blocking walls and the second blocking walls are coated at the same time without overlapping therebetween.

11. The panel of claim 10, wherein the first blocking walls and the second blocking walls are coated by using a mold.

12. A micro-light-emitting diode (microLED) display panel, comprising:
- a substrate;
- a plurality of microLEDs disposed and arranged in rows and columns on the substrate;
- a driver disposed on the substrate;
- a plurality of first blocking walls respectively disposed between rows of the microLEDs; and
- a plurality of second blocking walls respectively disposed between the microLEDs of the same row;

wherein microLEDs of the plurality of microLEDs within an area adjacent to the driver are asymmetrically arranged along at least one direction with respect to microLEDs of the plurality of microLEDs outside the area.

13. The panel of claim 12, wherein at least two rows of the microLEDs within the area adjacent to a top of the driver are shifted upward with respect to the microLEDs outside the area.

14. The panel of claim 12, wherein the plurality of microLEDs emit light against the substrate, thereby resulting in a top-emission display panel.

* * * * *